(12) United States Patent
Taniguchi et al.

(10) Patent No.: US 8,660,160 B2
(45) Date of Patent: Feb. 25, 2014

(54) SEMICONDUCTOR LASER ELEMENT AND METHOD OF MANUFACTURING THE SAME

(71) Applicant: Furukawa Electric Co., Ltd., Tokyo (JP)

(72) Inventors: Hidehiro Taniguchi, Tokyo (JP); Kouhei Kinugawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/658,836

(22) Filed: Oct. 24, 2012

(65) Prior Publication Data

US 2013/0044781 A1  Feb. 21, 2013

Related U.S. Application Data

(63) Continuation of application No. PCT/JP2011/002278, filed on Apr. 19, 2011.

(30) Foreign Application Priority Data

Apr. 26, 2010  (JP) ................................. 2010-101281

(51) Int. Cl.
*H01S 5/00*  (2006.01)
(52) U.S. Cl.
USPC ..................................... 372/45.01; 372/46.01
(58) Field of Classification Search
USPC ........................................... 372/45.01, 46.01
See application file for complete search history.

(56) References Cited

FOREIGN PATENT DOCUMENTS

| JP | H09-23037 A | 1/1997 |
|---|---|---|
| JP | H10-200190 A | 7/1998 |
| JP | 2001-15859 A | 1/2001 |
| JP | 2001-57459 A | 2/2001 |
| JP | 2001-135895 A | 5/2001 |
| JP | 2001-203423 A | 7/2001 |
| JP | 2002-26450 A | 1/2002 |
| JP | 2002-94179 A | 3/2002 |
| JP | 2007-242718 A | 9/2007 |
| JP | 2009-212336 A | 9/2009 |
| WO | 2009/031206 A1 | 3/2009 |
| WO | 2009/066739 A1 | 5/2009 |

OTHER PUBLICATIONS

International Search Report for International application PCT/JP2011/002278 completed on Jul. 12, 2011.
Nakashima H et al: "AlGaAs Window Stripe Buried Multi-Quantum Well Lasers Fabricated by Zn-diffusion-Induced Disordering"; Oct. 1, 1985.
Office action issued by the Japanese Patent Office, dated Sep. 2, 2010.
Office action issued by the Japanese Patent Office, dated Jan. 18, 2011.
Decision of Refusal issued by the Japanese Patent Office, dated May 19, 2011.
Explanation of Circumstances Concerning Accelerated Examination dated Jul. 29, 2010.

*Primary Examiner* — Armando Rodriguez

(57) ABSTRACT

A semiconductor laser element includes a substrate of a first conduction type and a layered semiconductor structure formed on the substrate. The layered semiconductor structure includes a first semiconductor layer of the first conduction type formed on the substrate, an active layer formed on the first semiconductor layer, and a second semiconductor layer of a second conduction type formed on the active layer, the second conduction type being opposite to the first conduction type. The first semiconductor layer, the active layer, and the second semiconductor layer include a non-window region through which a light emitted from the active layer passes and a window region surrounding the non-window region. Band gap energy of the active layer is larger in the window region than in the non-window region. The second semiconductor layer includes a current confinement layer.

14 Claims, 19 Drawing Sheets

SEMICONDUCTOR LASER ELEMENT AND METHOD OF MANUFACTURING THE SAME

CROSS-REFERENCE TO RELATED APPLICATION

The contents of the following patent application(s) are incorporated herein by reference:
NO. 2010-101281 filed on Apr. 26, 2010, and
NO. PCT/JP2011/002278 filed on Apr. 19, 2011.

BACKGROUND

1. Technical Field

The present invention relates to a semiconductor laser element having a window region and a current confinement structure and a method of manufacturing the semiconductor laser element. The contents of the following Japanese patent application are incorporated herein by reference,
No. 2010-101281 filed on Apr. 26, 2010

2. Related Art

When optical output from a semiconductor laser element is increased, heat may be generated near the facet due to light absorption. In this case, the heat could melt the facet so that the function of the laser element is terminated, possibly resulting in a phenomenon called COD (Catastrophic Optical Damage), which causes a problem of degrading the reliability of the semiconductor laser element. Techniques being developed to solve this problem involve making the facet transparent. By making the facet transparent, the optical output limit before the COD occurs can be improved.

Making the facet transparent involves widening the energy band gap of the semiconductor region near the facet of the semiconductor laser element, thereby causing the region near the facet to be transparent with respect to the emission wavelength and eventually preventing the light absorption. This transparent region is referred to as a "window region". The region that is surrounded by the window region, which is not transparent with respect to the light of interest, is referred to as a "non-window region". One specific method known for making the facet transparent involves disordering a semiconductor region near the facet by diffusing impurities or vacancies in the semiconductor region, thereby widening the energy band gap (see, for example, Patent Documents 1 to 4).

In order to inject current with high density into the active layer of the semiconductor laser element, the semiconductor laser element adopts a current confinement structure. The current confinement structure is a structure in which an n-type semiconductor current confinement layer is buried in a p-type semiconductor layer with an opening region of a predetermined width, for example. In the current confinement structure, the hole carriers injected from the upper portion of the p-type semiconductor layer flow only through the opening region of the current confinement layer. By decreasing the width of the current path, the current is injected to the active layer with increased current density. As a result, it is possible to achieve more efficient current injection and laser oscillation (see, for example, Patent Documents 1 and 2). The width of the region serving as the current path in the current confinement structure is referred to as the current confinement width.

Patent Document 1: Japanese Patent Application Laid-open No. 2007-242718
Patent Document 2: Japanese Patent Application Laid-open No. H09-23037
Patent Document 3: Japanese Patent Application Laid-open No. H10-200190
Patent Document 4: Japanese Patent Application Laid-open No. 2001-15859

DISCLOSURE OF THE INVENTION

However, when performing a thermal processing to form the window region, if vacancies, which are diffusion species, are diffused in the active layer, the optical output of the semiconductor laser element drops below the expected value.

SUMMARY

The present invention has been achieved in view of the above problems, and it is an object of the present invention to provide a semiconductor laser element that can realize higher optical output and a method of manufacturing the semiconductor laser element.

To solve the above problems and to achieve the object, according to one aspect of the present invention, there is provided a semiconductor laser element including a substrate and a layered semiconductor structure formed on the substrate. The layered semiconductor structure includes a semiconductor layer of a first conduction type formed on the substrate, an active layer formed on the semiconductor layer of the first conduction type, and a semiconductor layer of a second conduction type opposite to the first conduction type, formed on the active layer. The semiconductor layer of the first conduction type, the active layer, and the semiconductor layer of the second conduction type include a non-window region through which light emitted from the active layer passes and a window region surrounding the non-window region with band gap energy of the active layer larger than that in the non-window region. The semiconductor layer of the second conduction type includes a current confinement layer that protrudes toward the non-window region from an interface between the window region and the non-window region to narrow a current path through which current is injected into the active layer.

In the semiconductor laser element according to the present invention, the current confinement layer protrudes no less than 1.5 micrometers toward the non-window region. In the semiconductor laser element, a center position of a current confinement region surrounded by the current confinement layer may match a center position of the window region, and a condition of 3 micrometers being equal to or smaller than W2-W1 may be satisfied, where W2 and W1 are widths of the non-window region and the current confinement region, respectively, in a direction perpendicular to both a layer direction of the layered semiconductor structure and a direction of an output light. As an example, the width of the current confinement region may be set to a value for achieving a lateral single-mode operation.

In the semiconductor laser element according to the present invention, the current confinement layer is a semiconductor of the first conduction type and inserted within the semiconductor layer of the second conduction type. The diffusion species diffused in the window region and at least one of a dopant of the first conduction type and a dopant of the second conduction type doped in the layered semiconductor structure may replace a site of a corresponding group in a compound semiconductor forming the layered semiconductor structure. The window region is formed by vacancy diffusion. The semiconductor laser element may further include a first electrode for injecting a carrier of the first conduction type into the active layer via the semiconductor layer of the first conduction type, and a second electrode for injecting a carrier of the second conduction type into the active layer via the semiconductor layer of the second conduction type.

According to another aspect of the present invention, there is provided a method of manufacturing a semiconductor laser element including forming a semiconductor layer of a first conduction type on a substrate, forming an active layer on the semiconductor layer of the first conduction type, forming a semiconductor layer of a second conduction type opposite to the first conduction type on the active layer, and forming, in the semiconductor layer of the first conduction type, the active layer, and the semiconductor layer of the second conduction type, a non-window region through which light emitted from the active layer passes and a window region surrounding the non-window region with band gap energy of the active layer larger than that in the non-window region. The forming the semiconductor layer of the second conduction type includes forming a current confinement layer that protrudes toward the non-window region from an interface between the window region and the non-window region to narrow a current path through which current is injected into the active layer.

In the method according to the present invention, the forming the semiconductor layer of the second conduction type includes forming the current confinement layer to protrude no less than 1.5 micrometers toward the non-window region. The forming the semiconductor layer of the second conduction type may include forming the semiconductor layer of the second conduction type such that a center position of a current confinement region surrounded by the current confinement layer matches a center position of the window region, and a condition of 3 micrometers being equal to or smaller than W2-W1 is satisfied, where W2 and W1 are widths of the non-window region and the current confinement region, respectively, in a direction perpendicular to both a layer direction of the layered semiconductor structure and a direction of an output light.

In the method according to the present invention, the forming the window region may include forming the window region to satisfy a condition of W2-W1 being equal to or smaller than 50 micrometers. The forming the window region may include forming the window region by a vacancy diffusion.

According to the present invention, it is possible to achieve a semiconductor laser element with higher optical output.

DESCRIPTION OF EXEMPLARY EMBODIMENTS

Figure 1:
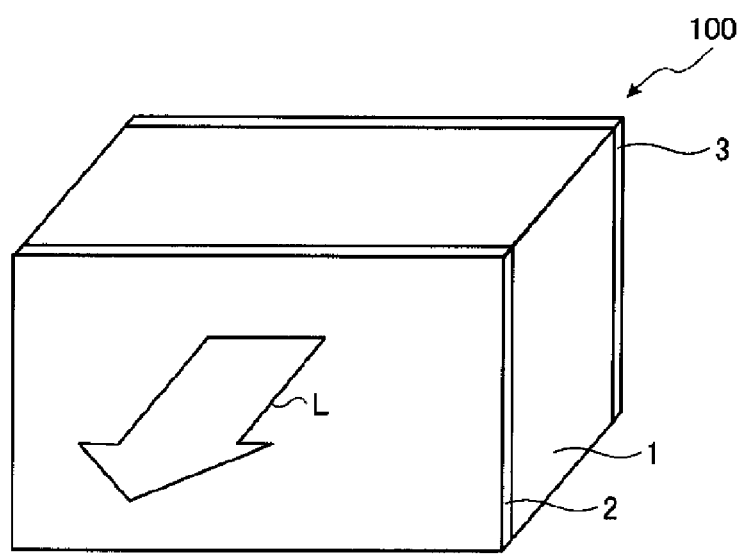
FIG. 1 is a schematic perspective view of a semiconductor laser element according to a first embodiment of the present invention.

The inventors of the present invention performed a rigorous study concerning the reason why the optical output of the semiconductor laser element disclosed in Patent Document 1 is lower than is expected from the design values. As a result of the study, it was found that the optical output characteristics are affected by a relation between the width of the non-window region and the width of the current confinement region. By optimally setting the relation between the width of the non-window region and the width of the current confinement region, the inventors managed to suppress the drop in the optical output and improve the optical output characteristics, thereby reaching the present invention.

Exemplary embodiments of a semiconductor laser element according to the present invention will be described in detail below with reference to accompanying drawings. However, the embodiments should not be construed to limit the present invention. In the Drawings, identical or equivalent elements are given the same reference numerals. The Drawings are schematic depictions, and do not represent the actual relations between the widths of various layers. Furthermore, different Drawings may include portions using different scales and dimensional relations.

First Embodiment

FIG. 1 is a schematic perspective view of a semiconductor laser element 100 according to a first embodiment of the present invention. As shown in FIG. 1, the semiconductor laser element 100 includes a low-reflection film 2 formed on a light emitting facet of a body 1 and a high-reflection film 3 formed on a rear facet of the body 1 opposite to the light emitting facet. Reflectivity of the low-reflection film 2 is no greater than 10%, for example. Reflectivity of the high-reflection film 3 is no less than 90%, for example. The semiconductor laser element 100 emits a lateral single-mode laser light L via the low-reflection film 2. The direction in which the semiconductor laser element 100 emits the laser light L is referred to as an "emission direction".

Figure 2:
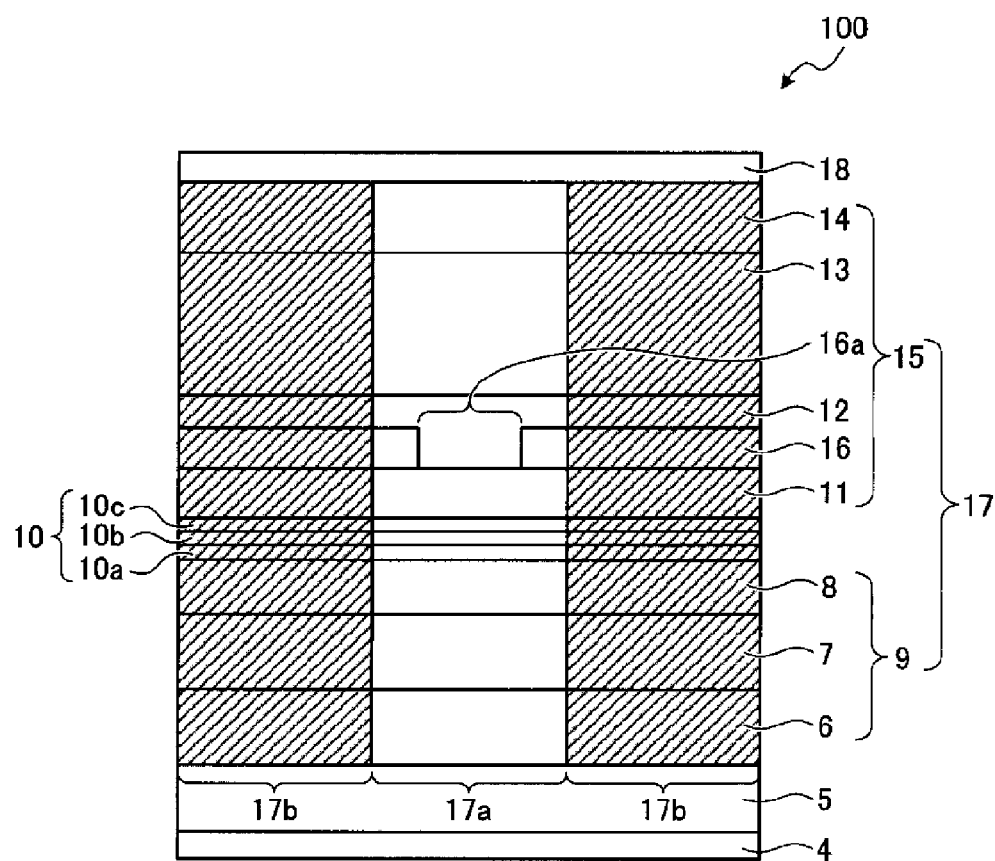
FIG. 2 is a cross-sectional view of a plane perpendicular to an emission direction in a body of the semiconductor laser element shown in FIG. 1.

FIG. 2 is a cross-sectional view of a plane perpendicular to the emission direction in the body 1 of the semiconductor laser element 100 shown in FIG. 1. As shown in FIG. 2, the semiconductor laser element 100 includes a bottom electrode 4, a substrate 5, a layered semiconductor structure 17, and a top electrode 18. The bottom electrode 4 is an n-side electrode for injecting electron carriers into an active layer 10 via an n-type semiconductor layer region 9. The bottom electrode 4 is formed on the bottom surface of the substrate 5. The substrate 5 is made of n-type GaAs, where the n-type is defined as a first conduction type.

The layered semiconductor structure 17 includes the n-type semiconductor layer region 9, the active layer 10, and a p-type semiconductor layer region 15. The n-type semiconductor layer region 9 includes an n-type buffer layer 6, an n-type cladding layer 7, and an n-type guide layer 8 formed in the stated order on the substrate 5. The p-type semiconductor layer region 15 includes a p-type guide layer 11, a p-type guide layer 12, a p-type cladding layer 13, a p-type contact layer 14, and an n-type current confinement layer 16, where the p-type is defined as a second conduction type.

The n-type current confinement layer 16 narrows the current path through which current is injected into the active layer 10. The n-type current confinement layer 16 is inserted within the p-type semiconductor layer region 15. The top electrode 18 is formed on the p-type contact layer 14. The top electrode 18 is a p-side electrode that injects hole carriers into the active layer 10 via the p-type semiconductor layer region 15.

The n-type buffer layer 6 is made of GaAs, and is a buffer layer grown on the substrate 5 to have a layered structure of high quality epitaxial layers. The n-type cladding layer 7 and the n-type guide layer 8 are made of AlGaAs with thicknesses and refractive indexes for realizing an optical confinement state with respect to the layer direction. The Al composition of the n-type guide layer 8 is preferably greater than or equal to 20% and less than 40%. The refractive index of the n-type cladding layer 7 is less than the refractive index of the n-type guide layer 8.

The thickness of the n-type guide layer 8 is preferably no less than 50 nanometers. For example, the thickness of the n-type guide layer 8 is preferably approximately 400 nanometers. The thickness of the n-type cladding layer 7 is no less than 1 micrometer. For example, the thickness of the n-type cladding layer 7 is preferably approximately 3 micrometers. The n-type semiconductor layer region 9 includes silicon (Si), for example, as an n-type dopant.

The active layer 10 includes a bottom barrier layer 10a, a quantum well layer 10b, and a top barrier layer 10c, making up a single quantum well (SQW) structure. The bottom barrier layer 10a and the top barrier layer 10c function as a barrier that confines the carriers in the quantum well layer 10b. For example, the bottom barrier layer 10a and the top barrier layer 10c may be made from highly-pure AlGaAs that does not contain any intentionally-doped dopants, and the quantum well layer 10b may be made of highly-pure InGaAs that does not contain any intentionally-doped dopants.

The In composition and the thickness of the quantum well layer 10b, the composition of the bottom barrier layer 10a, and the composition of the top barrier layer 10c are set according to a desired center wavelength, such as 0.98 micrometers, in the emitted light. The active layer 10 may have a multiple quantum well (MQW) structure including a plurality of pairs of the quantum well layer and the barrier layer in a repeated manner, or may have a bulk structure without having the bottom barrier layer 10a and the top barrier layer 10c. The quantum well layer 10b, the bottom barrier layer 10a, and the top barrier layer 10c may have acceptors or intentionally-doped dopants doped therein.

The p-type guide layer 11, the p-type guide layer 12, and the p-type cladding layer 13 form a pair with the n-type cladding layer 7 and the n-type guide layer 8 described above, and are made of AlGaAs with refractive indexes and thicknesses for realizing an optical confinement state with respect to the layer direction. The Al composition of the p-type guide layer 11 and the p-type guide layer 12 is preferably greater than or equal to 20% and less than 40%. The refractive index of the p-type cladding layer 13 is less than the refractive index of the p-type guide layer 11 and the refractive index of the p-type guide layer 12.

By setting the refractive index of each layer such that the optical field in the layers is skewed in the direction of the n-type cladding layer 7, the waveguide loss can be decreased. For example, the Al composition of the p-type cladding layer 13 is significantly greater than the Al composition of the n-type cladding layer 7. The Al composition of the p-type guide layer 11 and the p-type guide layer 12 is less than the Al composition of the p-type cladding layer 13. The combined thickness of the p-type guide layer 11 and the p-type guide layer 12 is preferably no less than 50 nanometers. The thickness of the p-type cladding layer 13 is preferably between approximately 1 micrometer and 2 micrometers. The p-type semiconductor layer region 15 includes zinc (Zn) as a p-type dopant.

The n-type current confinement layer 16 is buried in the p-type guide layer 12. The n-type current confinement layer 16 is made of AlGaAs including a current confinement region 16a formed as an opening portion. In other words, the current confinement region 16a is surrounded by the n-type current confinement layer 16.

The p-type contact layer 14 is made of GaAs doped with a high concentration of Zn. The bottom electrode 4 and the top electrode 18 are made of metal material that can make ohmic contact with semiconductor material. In this way, the semiconductor laser element 100 includes group III-V compound semiconductor material.

Figure 3:
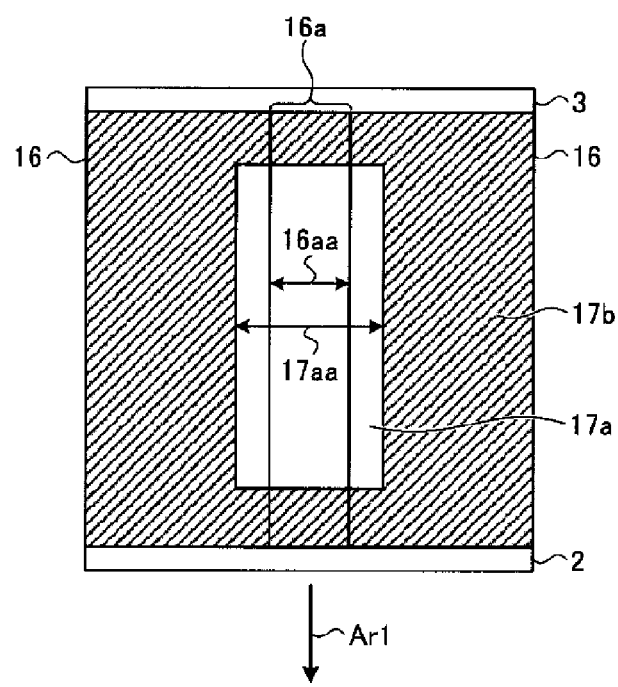
FIG. 3 is a horizontal cross section through an n-type current confinement layer of the semiconductor laser element shown in FIG. 2.

The n-type semiconductor layer region 9, the active layer 10, and the p-type semiconductor layer region 15 include a non-window region 17a through which the light emitted from the active layer 10 passes and a window region 17b in which the band gap energy of the active layer 10 is greater than in the non-window region 17a. FIG. 3 is a horizontal cross section through the n-type current confinement layer 16 of the semiconductor laser element 100 shown in FIG. 2. As shown in FIGS. 2 and 3, the non-window region 17a has a center position, i.e. a width center, in a width direction that is perpendicular to both an emission direction Ar1 and the layer direction of the layered semiconductor structure 17, and this center position is formed to match the center position in the width direction of the current confinement region 16a.

The window region 17b is formed around the non-window region 17a. The window region 17b is formed in a region closer to the four sides of the semiconductor laser element 100 than the non-window region 17a. The window region 17b is a disordered region in which group III vacancies are diffused by a thermal processing. By disordering the window region 17b, the difference in the energy band gap between the window region 17b and the active layer 10 of the non-window region 17a becomes no less than 10 meV, for example, where 1 eV is approximately $1.60 \times 10^{-19}$ Joules. The window region is a region that is disordered and has band gap energy greater than the band gap energy in the region near the center of the active layer where current is injected. The non-window region is the region other than the window region.

As shown in FIG. 3, the non-window region 17a has a non-window width 17aa. The n-type current confinement layer 16 protrudes toward the non-window region 17a from the interface between the non-window region 17a and the window region 17b. The n-type current confinement layer 16 protrudes by a distance no less than 1.5 micrometers, for example, toward the non-window region 17a from the interface.

The current confinement region 16a has a current confinement width 16aa. The semiconductor laser element 100 has a self alignment structure (SAS), and light emitted from the active layer 10 is confined in the region directly below the current confinement region 16a in the width direction, which is perpendicular to the emission direction Ar1. The current confinement width 16aa is set to 3 micrometers, for example, such that the semiconductor laser element 100 realizes a lateral single-mode operation.

With W1 representing the current confinement width 16aa and W2 representing the non-window width 17aa, the semiconductor laser element 100 satisfies a condition of 3 micrometers being equal to or smaller than W2-W1. Therefore, since the non-window width 17aa is at least 3 micrometers wider than the current confinement width 16aa, when performing the thermal processing to form the window region 17b, the group III vacancies, which are diffusion species, can be prevented from diffusing in the region of the active layer 10 into which the current is to be injected. As a result, the drop in optical output of the laser light L is prevented, and therefore the semiconductor laser element 100 can output a high-power laser light.

The following describes the operation of the semiconductor laser element 100. When a voltage is applied between the bottom electrode 4 and the top electrode 18, carriers are injected into the active layer 10 from the n-type semiconductor layer region 9 and the p-type semiconductor layer region 15. The carriers injected from the top electrode 18 via the p-type semiconductor layer region 15 flow through a current path that is narrowed by the current confinement region 16a of the n-type current confinement layer 16, and are efficiently injected into the active layer 10 with high current density.

The active layer 10 into which the carriers are injected emits light of a predetermined center wavelength. While being confined and guided by the active layer 10, the emitted light achieves laser oscillation due to the optical amplification effect of the active layer 10 and the optical resonating effect of a cavity formed by the low-reflection film 2 and the high-reflection film 3. As a result, the semiconductor laser element 100 emits the lateral single-mode laser light L, as shown in FIG. 1. The semiconductor laser element 100 prevents the occurrence of COD because the absorption of the laser light L in the facet is relieved by the window region 17b.

In the semiconductor laser element 100, the vacancies, which are diffusion species, replace the group III site. The semiconductor laser element 100 preferably includes a p-type dopant that occupies the group III site, such that the diffusion species replaces the group III site. This p-type dopant is Zn, for example. As a result of the semiconductor laser element 100 including the p-type dopant replaced with the diffusion species, the diffusion of the diffusion species on the window region 17b is restricted. As a result, the non-window region 17a has the width intended by design. The diffusion species diffused in the window region and at least one of the p-type dopant and n-type dopant doped in the layered semiconductor structure 17 may replace the group III site, which is a site of the same group as the compound semiconductor forming the layered semiconductor structure 17.

If vacancies are used as the diffusion species of the window region 17b, as in the first embodiment, unintentional diffusion of the p-type dopant can be more effectively restricted, and therefore the use of the vacancies is preferable. The reason for this is that the vacancies, which are holes from which atoms are taken out, can recombine with the p-type dopant occupying the same-group site more easily than impurity atoms.

The following is a detailed description of a preferable relation between the current confinement width 16aa and the non-window width 17aa, based on experimental results. A plurality of semiconductor laser elements 100 were manufactured having the same structure as the semiconductor laser element 100 according to the first embodiment, where each of the semiconductor laser elements 100 had a current confinement width of 3 micrometers with different non-window width. Among the semiconductor laser elements 100 manufactured to have the same non-window widths, the thermal processing was used to form the window regions in some of the semiconductor laser elements 100 while the thermal processing was not used for others. The optical output of the semiconductor laser elements 100 when a predetermined drive current was input thereto was measured.

Figure 4:
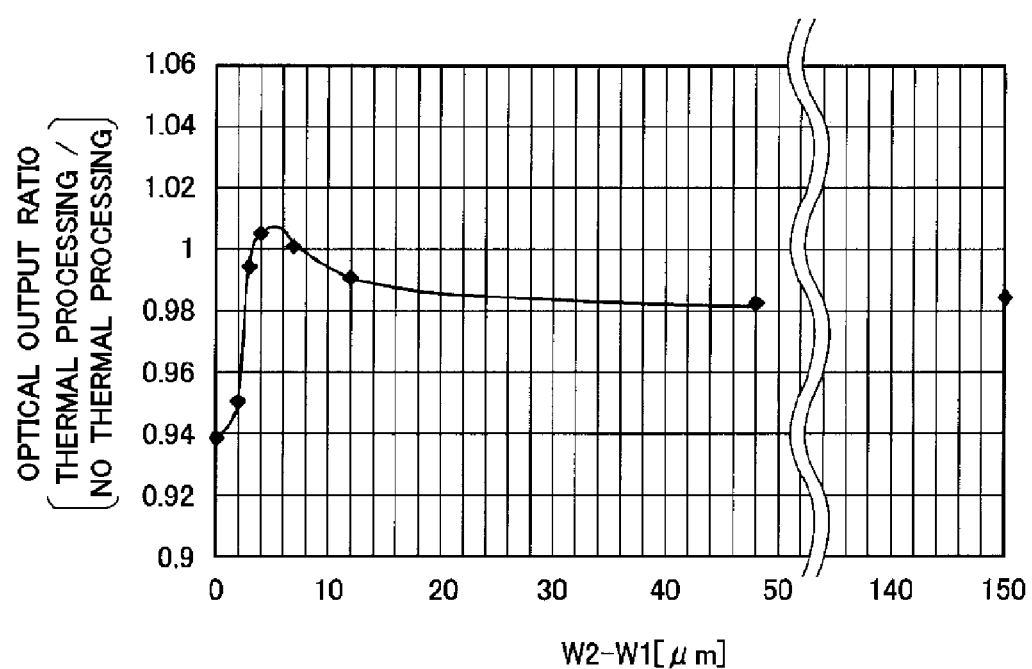
FIG. 4 shows a relation between optical output ratio and W2-W1, where the optical output ratio is a ratio of optical output of a semiconductor laser element with thermal processing to optical output of a semiconductor laser element without thermal processing.

FIG. 4 shows a relation between optical output ratio and difference (W2-W1) between the non-window width and the current confinement width, where the optical output ratio is a ratio of optical output of the semiconductor laser element 100 with the thermal processing to optical output of the semiconductor laser element 100 without the thermal processing. As shown in FIG. 4, when W2-W1 is 0 micrometers or 2 micrometers, the optical output ratio is as low as 0.94 to 0.95, indicating that the optical output decreased due to the thermal processing for forming the window region. On the other hand, when 3 micrometers is equal to or smaller than W2-W1, the optical output ratio is greater than or equal to 0.98, indicating that there is virtually no drop in the optical output due to the thermal processing to form the window region.

As shown in FIG. 4, semiconductor laser elements 100 in which W2-W1 is 50 micrometers and semiconductor laser elements 100 in which W2-W1 is 150 micrometers have virtually the same optical output ratio. On the other hand, semiconductor laser elements 100 that satisfy the condition of W2-W1 being equal to or smaller than 50 micrometers have optical output ratios that gradually increase from 0.98 in accordance with a decreasing value of W2-W1, and therefore it is preferable that W2-W1 be equal to or smaller than 50 micrometers. The optical output ratio increases sharply when W2-W1 is equal to or smaller than 12 micrometers, and therefore this is a more preferable value range for W2-W1. The increase of the optical output ratio is even more drastic when W2-W1 is equal to or smaller than 7 micrometers, and therefore this is an even more preferable value range for W2-W1.

Figure 5:
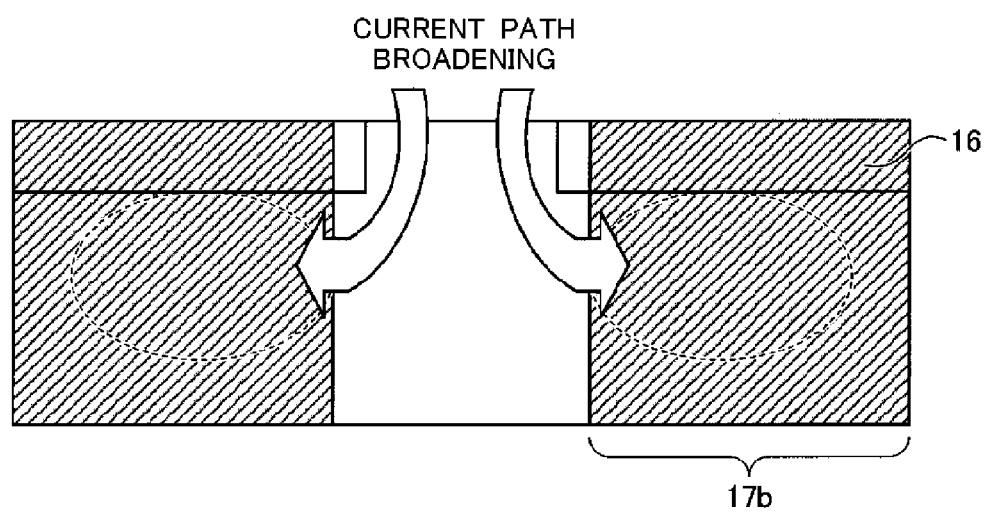
FIG. 5 shows broadening of a current path due to diffusion of a p-type dopant.

The reason why the optical output ratio is at the maximum when W2-W1 is approximately 5 micrometers and gradually decreases as W2-W1 increases beyond approximately 5 micrometers, as shown in FIG. 5, is thought to be that the thermal processing for forming the window region causes the p-type dopant to be diffused in the p-type semiconductor layer region 15. Diffusing the p-type dopant causes an increase in the p-type dopant concentration in the region directly below the n-type current confinement layer 16 overlapping with the window region 17b. As a result, it is believed that the electrical resistance in this region decreases and the electrical path expands, causing the optical output to decrease.

Figure 6:
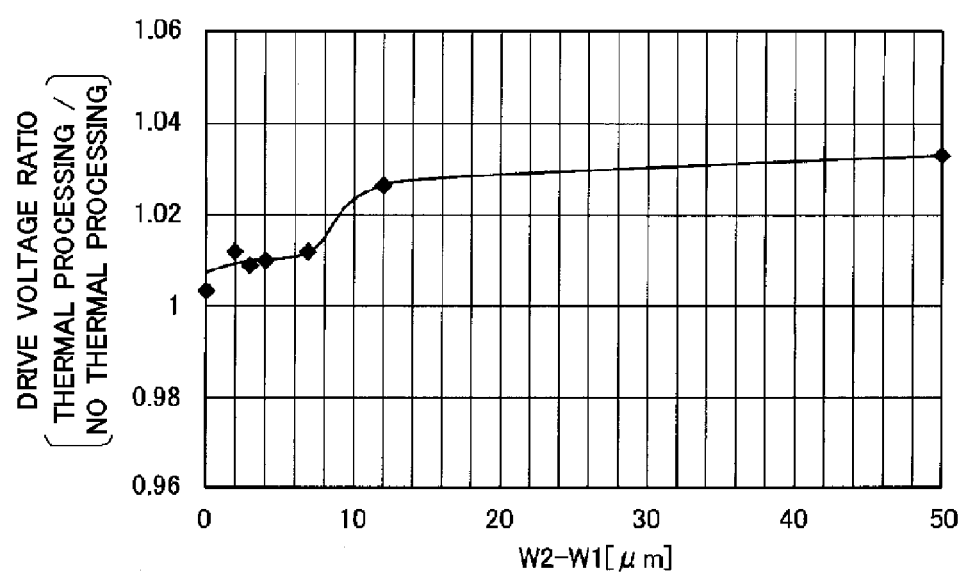
FIG. 6 shows a relation between drive voltage ratio and W2-W1, where the drive voltage ratio is a ratio of drive voltage of a semiconductor laser element with thermal processing to drive voltage of a semiconductor laser element without thermal processing with a predetermined drive current.

FIG. 6 shows a relation between drive voltage ratio and W2-W1, where the drive voltage ratio is a ratio of drive voltage of the semiconductor laser element 100 with the thermal processing and drive voltage of the semiconductor laser element 100 without the thermal processing. The drive voltage refers to a drive voltage in a case when a predetermined drive current is applied to the semiconductor laser element 100. As shown in FIG. 6, in the semiconductor laser elements 100 that satisfy the condition of W2-W1 being equal to or smaller than 12 micrometers, smaller values of W2-W1 cause a drop in the drive voltage ratio.

The drive voltage ratio is extremely low when W2-W1 is equal to or smaller than 7 micrometers, and it is therefore preferable that the semiconductor laser element 100 satisfy the condition W2-W1 be equal to or smaller than 7 micrometers. By restricting an increase in the drive voltage in this way, the power consumption can be decreased. The reason why larger values of W2-W1 cause an increase in the drive voltage is believed to be that dopant diffusion causes an increase in the contact resistance between the contact layer and the top electrode.

Figure 7:
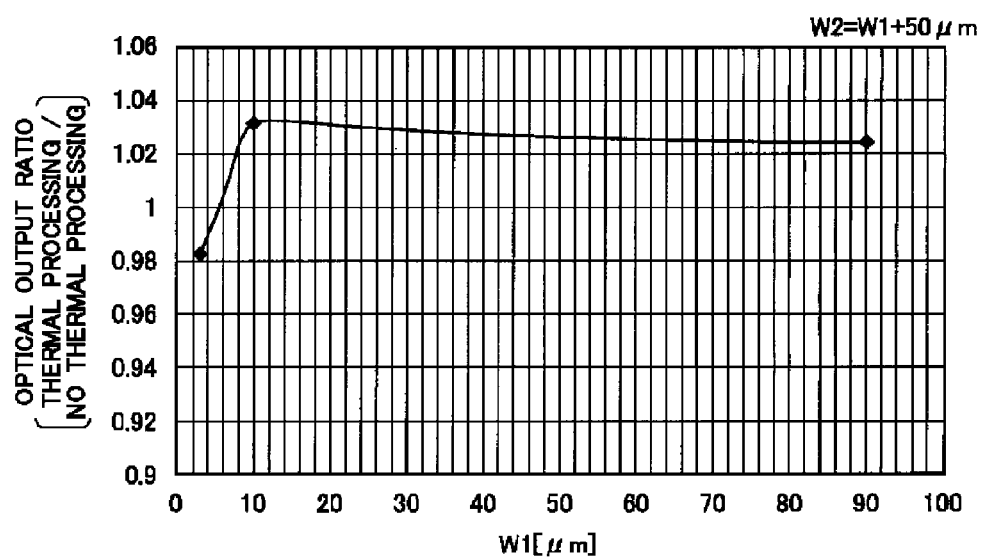
FIG. 7 shows a relation between the optical output ratio and W1 with W2 fixed to W2=W1+50 micrometers.

FIG. 7 shows a relation of the optical output ratio and W1 in the semiconductor laser elements 100 that satisfy the condition of W2 being equal to W1+50 micrometers. As shown in FIG. 7, the optical output ratio decreases drastically when W1 is equal to or smaller than 10 micrometers. As described in relation to FIG. 4, the optical output ratio increases when W2-W1 decreases. Accordingly, when W1 is equal to or smaller than 10 micrometers, the decrease in the optical output ratio can be restricted by setting W2-W1 to be no greater than 50 micrometers, 12 micrometers, and 7 micrometers, with increasing degrees of effectiveness.

As described above, when the current confinement width 16aa is W1 and the non-window width 17aa is W2, the semiconductor laser element 100 according to the first embodiment satisfies the condition of 3 micrometers being equal to or smaller than W2-W1, and can therefore output a high-power laser light.

The following describes a method of manufacturing the semiconductor laser element 100. FIGS. 8A to 14 are schematic diagrams for explaining an example of the method.

Figure 8A:
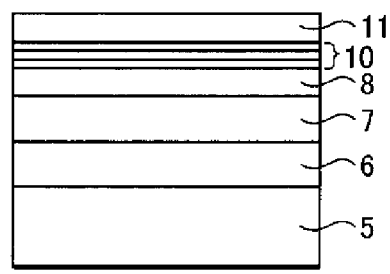
FIGS. 8A to 8C are schematic diagrams for explaining an example of a method of forming a layered semiconductor structure on a substrate.

As shown in FIG. 8A, MOCVD (Metal Organic Chemical Vapor Deposition) is used to epitaxially grow the n-type buffer layer 6, the n-type cladding layer 7, the n-type guide layer 8, the active layer 10, and the p-type guide layer 11 on the substrate 5.

Figure 8B:
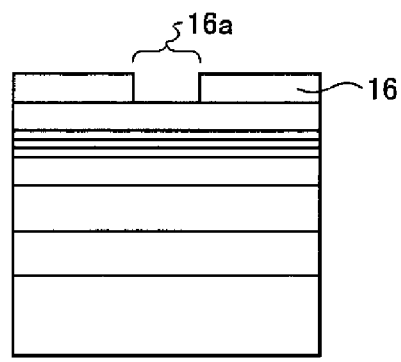
Figure 8C:
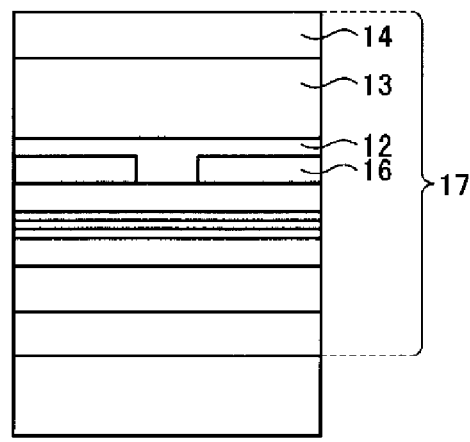

Next, as shown in FIG. 8B, patterning is performed using photolithography to form the n-type current confinement layer 16 having the current confinement region 16a with the current confinement width intended by the design. After this, MOCVD is used to grow the p-type guide layer 12, the p-type cladding layer 13, and the p-type contact layer 14 to form the layered semiconductor structure 17 having the SAS, as shown in FIG. 8C.

Figure 9:
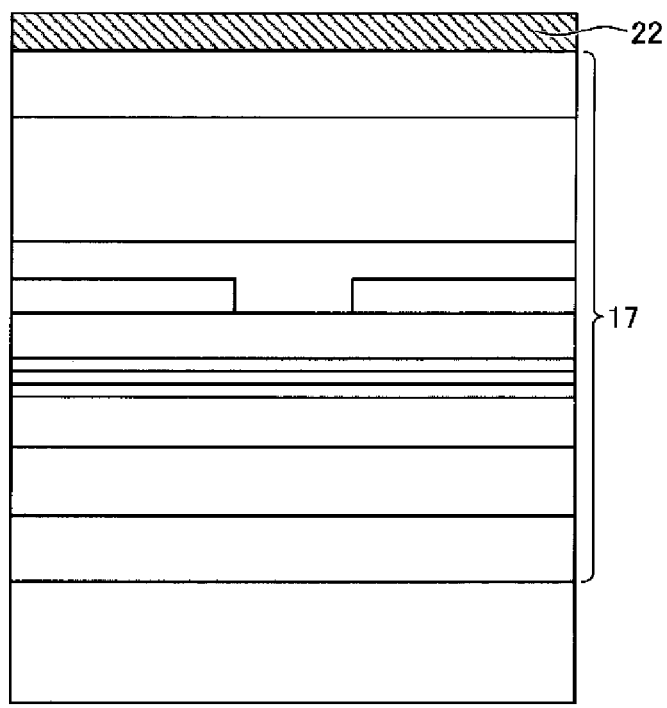
FIG. 9 shows a disordering activating film formed on the top surface of the layered semiconductor structure shown in FIG. 8C.
Figure 10:
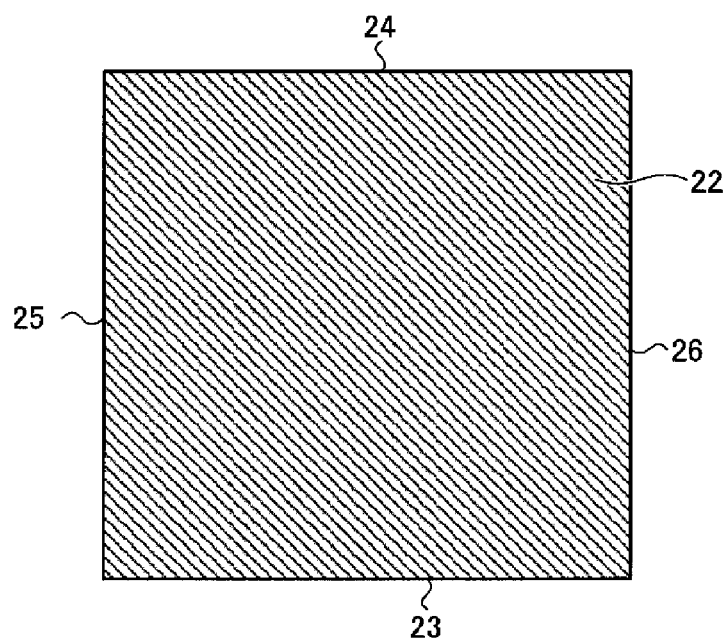
FIG. 10 is a plan view of the disordering activating film shown in FIG. 9, as seen from above.

Next, the vacancy diffusion is used to achieve the disordering, thereby realizing the window region. This method is known as IFVD (Impurity Free Vacancy Disordering). Specifically, as shown in FIG. 9, a disordering activating film 22, which is a low-density SiN insulating film, is formed on the top surface of the layered semiconductor structure 17. FIG. 10 is a view of the disordering activating film 22 shown in FIG. 9, as seen from above. In FIG. 10, reference numerals 23, 24, 25, and 26 respectively indicate positions corresponding to the light emitting facet, the rear facet, the left side, and the right side of the semiconductor laser element 100.

Figure 11:
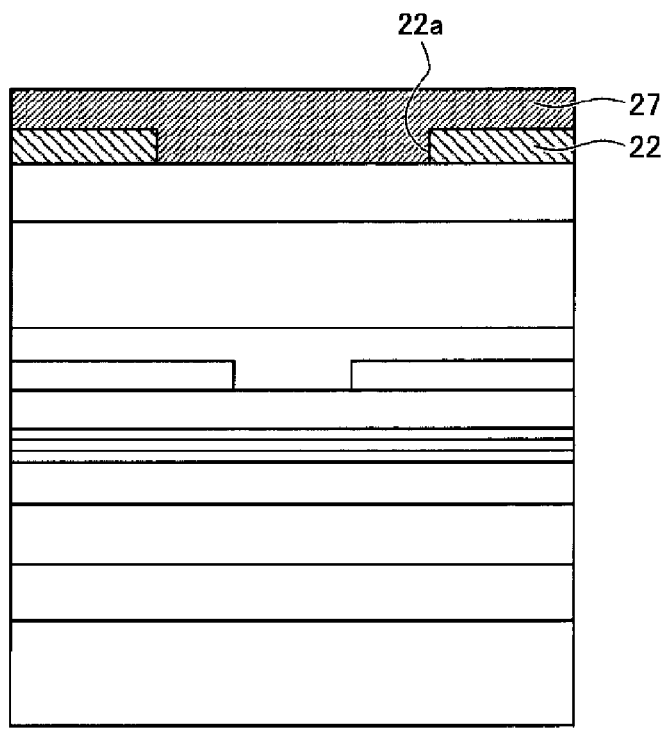
FIG. 11 is a schematic diagram for explaining an example of a method of forming a disordering inhibiting film, which is a dense SiN insulating film.
Figure 12:
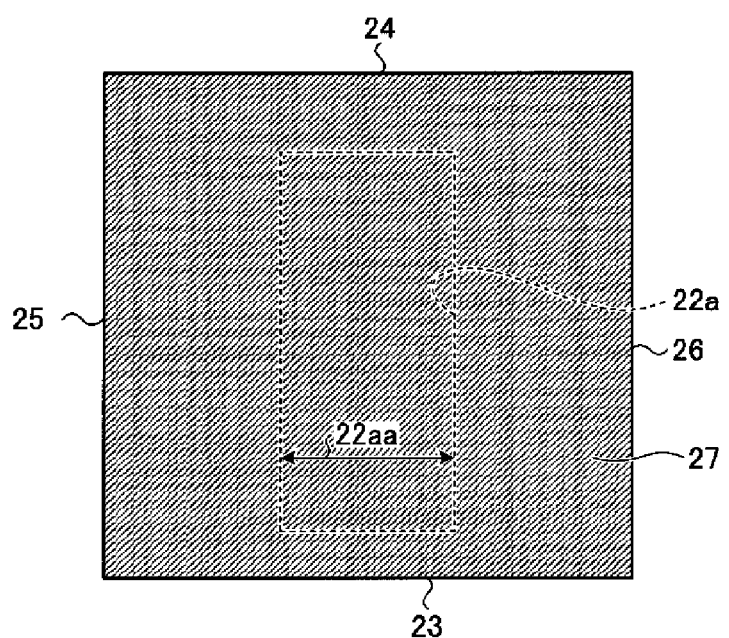
FIG. 12 is a plan view of the disordering inhibiting film shown in FIG. 11, as seen from above.

Next, as shown in FIG. 11, photolithography and etching are used to form an opening portion 22a by removing the disordering activating film 22 in the region where the non-window region 17a is to be formed. After this, a disordering inhibiting film 27, which is a dense SiN insulating film, is formed. FIG. 12 is a view of the disordering inhibiting film 27 shown in FIG. 11, as seen from above. In FIG. 12, the reference numerals 23, 24, 25, and 26 respectively indicate positions corresponding to the light emitting facet, the rear facet, the left side, and the right side of the semiconductor laser element 100, and a width 22aa of the opening portion 22a corresponds to the non-window width. The opening portion 22a is formed such that the width 22aa is at least 3 micrometers wider than the current confinement width 16aa.

Figure 13:
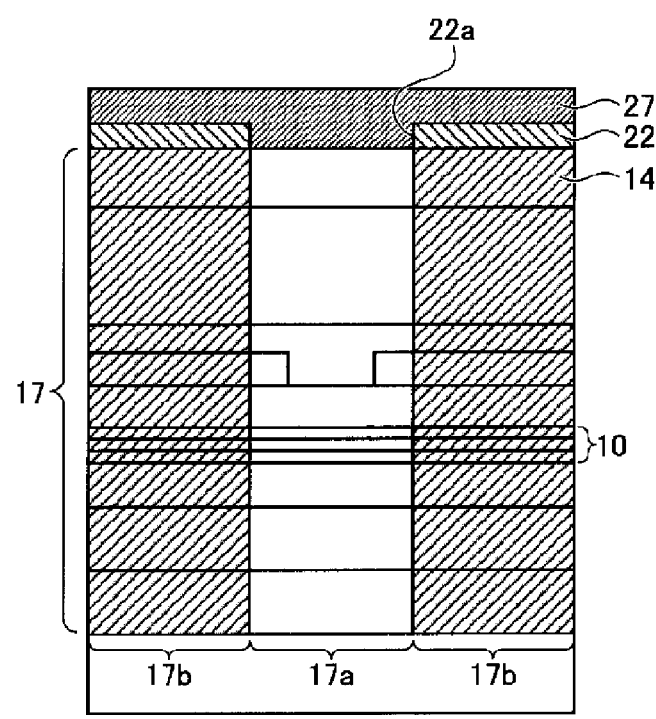
FIG. 13 shows a window region formed by performing a thermal processing on the substrate shown in FIG. 11.

Next, RTA (Rapid Thermal Annealing) is used to perform the thermal processing in a short time. The disordering activating film 22 is a low-density film, and can therefore absorb Ga. Accordingly, when the thermal processing is performed using the RTA, Ga, which is a constituent element of the layered semiconductor structure 17 below the disordering activating film 22, is absorbed by the disordering activating film 22, and the group III vacancies are generated on the top surface of the p-type contact layer 14 directly below the disordering activating film 22. The generated group III vacancies are diffused as the diffusion species, and each semiconductor layer, particularly the active layer 10, is disordered, thereby forming the window region 17b as shown in FIG. 13.

On the other hand, in the region where the disordering inhibiting film 27 is formed contacting the p-type contact layer 14, the disordering inhibiting film 27, which is a dense film, does not absorb the Ga, and therefore diffusion of the Ga is restricted. As a result, the region where the disordering inhibiting film 27 is formed is not disordered because the group III vacancies are not generated, thereby forming the non-window region 17a without containing a disordered portion.

Since the width 22aa of the opening portion 22a of the disordering activating film 22 is at least 3 micrometers greater than the current confinement width 16aa, the diffusion of the group III vacancies during the thermal processing is restricted by the p-type dopant Zn. As a result, the group III vacancies are prevented from diffusing into the region where the active layer 10 is to emit light. Unintentional diffusion of the Zn occupying the group III site is also restricted.

Figure 14:
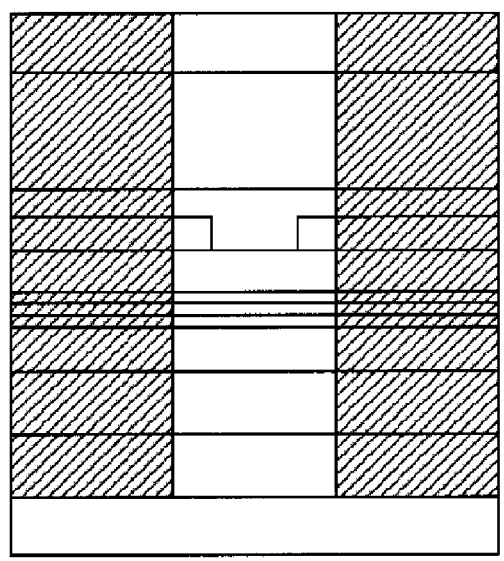
FIG. 14 shows the substrate from which the disordering activating film and the disordering inhibiting film are removed.

Next, as shown in FIG. 14, the disordering activating film 22 and the disordering inhibiting film 27 are removed. After this, the top electrode 18 and the bottom electrode 4 on the bottom surface of the substrate 5 are formed. Furthermore, the substrate is cleaved to form the facets on which the low-reflection film 2 and the high-reflection film 3 are formed. The structure formed as described above is cut in a predetermined size to complete the semiconductor laser element 100.

Second Embodiment

The following describes a semiconductor laser element according to a second embodiment of the present invention. The semiconductor laser element according to the second embodiment has a ridge structure, which enables confinement of light in the width direction and realizes a current confinement structure.

Figure 15:
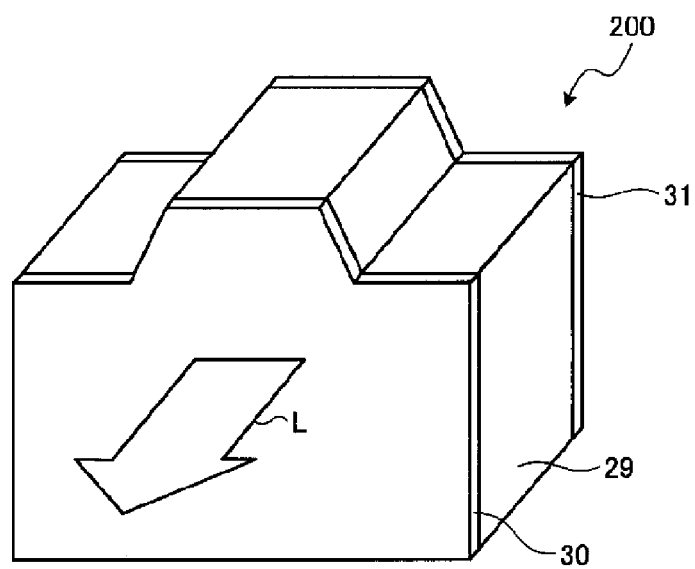
FIG. 15 is a schematic perspective view of a semiconductor laser element according to a second embodiment.

FIG. 15 is a schematic perspective view of a semiconductor laser element 200 according to the second embodiment. As shown in FIG. 15, the semiconductor laser element 200 includes a low-reflection film 30 formed on a light emitting facet of a body 29 and a high-reflection film 31 formed on a rear facet opposite to the light emitting facet, in the same manner as the semiconductor laser element 100. The semiconductor laser element 200 emits a lateral single-mode laser light L via the low-reflection film 30.

Figure 16:
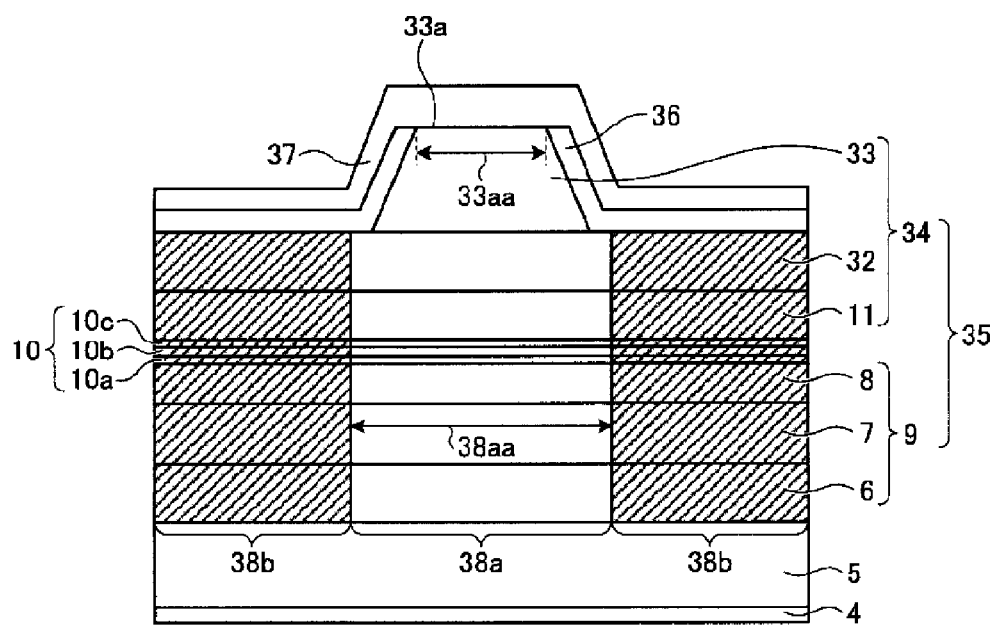
FIG. 16 is a cross-sectional view of a plane perpendicular to an emission direction in a body of the semiconductor laser element shown in FIG. 15.

FIG. 16 is a cross-sectional view of a plane perpendicular to the emission direction in the body 29 of the semiconductor laser element 200 shown in FIG. 15. As shown in FIG. 16, the semiconductor laser element 200 includes the bottom electrode 4, the substrate 5, a layered semiconductor structure 35, an insulating film 36, and a top electrode 37. The bottom electrode 4 is an n-side electrode. The bottom electrode 4 is formed on the bottom surface of the substrate 5. The substrate 5 is made of n-type GaAs, where the n-type is defined as a first conduction type.

The layered semiconductor structure 35 includes the n-type semiconductor layer region 9, the active layer 10, and a p-type semiconductor layer region 34. The n-type semiconductor layer region 9 includes the n-type buffer layer 6, the n-type cladding layer 7, and the n-type guide layer 8 formed in the stated order on the substrate 5. The p-type semiconductor layer region 34 includes the p-type guide layer 11, a p-type cladding layer 32, and a p-type contact layer 33, and p-type is a second conduction type. The p-type contact layer 33 has a trapezoidal cross section, and extends as a stripe in the emission direction. In other words, the semiconductor laser element 200 has a ridge structure.

The insulating film 36 is formed on the p-type semiconductor layer region 34. The top electrode 37 is a p-side electrode that contacts the p-type contact layer 33 via the top surface of the ridge structure where the insulating film 36 is not formed. The insulating film 36 provides insulation between the top electrode 37 and the inclined surfaces of the p-type contact layer 33.

The p-type contact layer 33 contains GaAs doped with a high concentration of Zn. The insulating film 36 is made of $SiN_x$, for example. The top electrode 37 is made of metal material that can make ohmic contact with semiconductor material.

In the semiconductor laser element 200, the current confinement structure is realized by the insulating film 36 limiting the contact surface area between the top electrode 37 and the p-type semiconductor layer region 34. Specifically, the current path through which hole carriers to be injected from the top electrode 37 via the p-type semiconductor layer region 34 move is narrowed by a current confinement region 33a, which is the top surface of the p-type contact layer 33. Therefore, the hole carriers can be efficiently injected into the active layer 10 with high current density, to be used for laser oscillation of the laser light L.

The layered semiconductor structure 35 includes a non-window region 38a and a window region 38b in which the band gap energy of the active layer 10 is greater than in the non-window region 38a. In the same manner as the semiconductor laser element 100, the non-window region 38a has a center position in a width direction that is perpendicular to both the emission direction and the layer direction of the layered semiconductor structure 35, and this center position is formed to match the center position in the width direction of the current confinement region 33a.

The window region 38b is formed around the non-window region 38a. The window region 38b is formed in a region closer to the four sides of the semiconductor laser element 200 than the non-window region 38a. The window region 38b is a disordered region in which group III vacancies are diffused by a thermal processing. By disordering the window region 38b, the difference in the energy band gap between the window region 38b and the active layer 10 of the non-window region 38a becomes no less than 10 meV, for example.

In the semiconductor laser element 200 according to the second embodiment, the non-window region 38a has a non-window width 38aa and the current confinement region 33a has a current confinement width 33aa, as shown in FIG. 16. The current confinement width 33aa is set to 3 micrometers, for example, such that the semiconductor laser element 200 realizes a lateral single-mode operation.

The occurrence of COD is prevented in the semiconductor laser element 200, because the absorption of the laser light L in the facet is relieved by the window region 38b. Furthermore, with W1 representing the current confinement width 33aa and W2 representing the non-window width 38aa, the semiconductor laser element 200 satisfies the condition of 3 micrometers being equal to or smaller than W2-W1. Therefore, in the same manner as the semiconductor laser element 100, vacancies can be prevented from diffusing during the thermal processing for forming the window region 38b. As a result, the drop in optical output of the laser light L is prevented, and therefore the semiconductor laser element 200 can output a high-power laser light.

The following describes a method of manufacturing the semiconductor laser element 200. FIGS. 17A to 18C are schematic diagrams for explaining an example of the method.

Figure 17A:
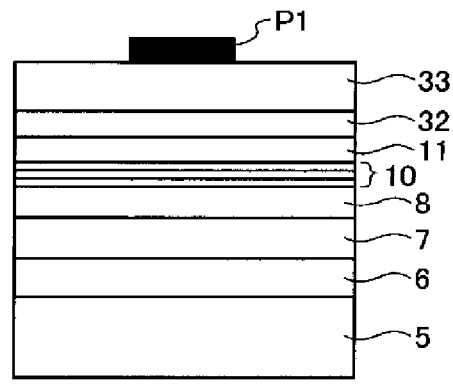
FIGS. 17A to 17C are schematic diagrams for explaining an example of a method of forming a ridge structure shown in FIG. 16.
Figure 17B:
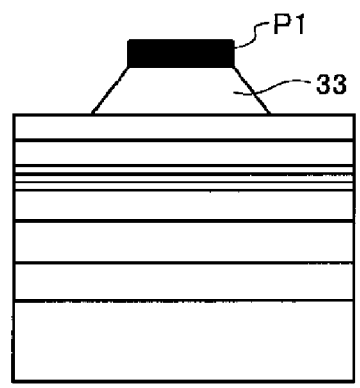
Figure 17C:
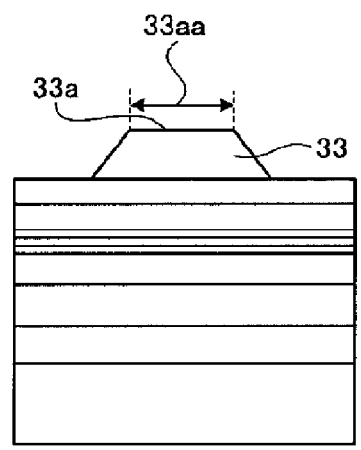

First, as shown in FIG. 17A, MOCVD is used to epitaxially grow the n-type buffer layer 6, the n-type cladding layer 7, the n-type guide layer 8, the active layer 10, the p-type guide layer 11, the p-type cladding layer 32, and the p-type contact layer 33 on the substrate 5. Photolithography is then used to form a stripe pattern P1, which is made of a resist and used to form the ridge structure, on the p-type contact layer 33. Next, as shown in FIGS. 17B and 17C, the p-type contact layer 33 is etched to have a trapezoidal shape and the stripe pattern P1 is then removed. As a result, the p-type contact layer 33 is formed having a ridge structure in which the current confinement region 33a, which is the top surface of the p-type contact layer 33, has the desired current confinement width 33aa.

Figure 18A:
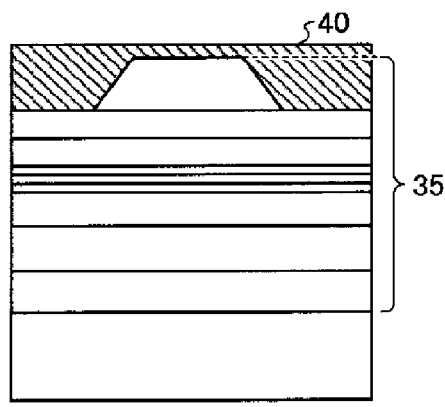
FIGS. 18A to 18C are schematic diagram for explaining an example of a method of forming a disordering activating film, a disordering inhibiting film, and a non-window region directly below the disordering inhibiting film.
Figure 18B:
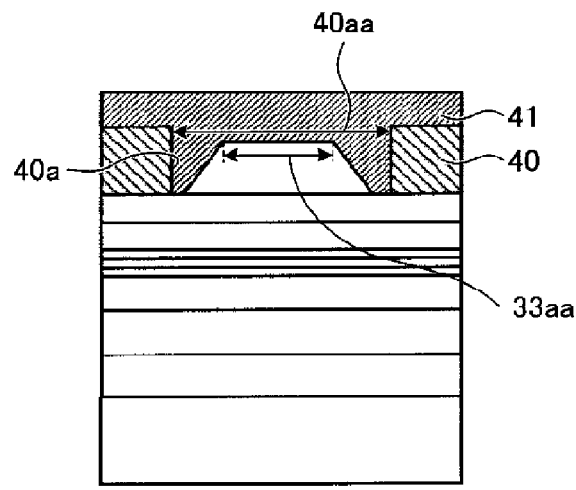
Figure 18C:
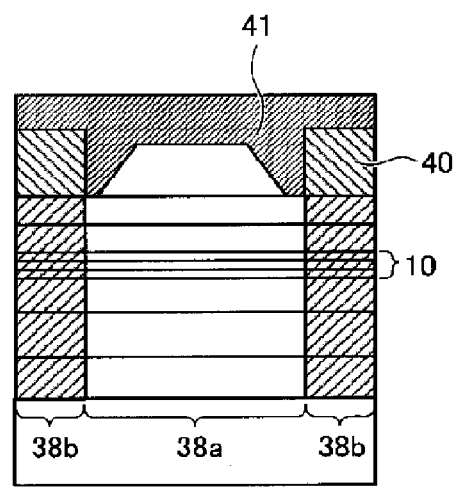

Next, the vacancy diffusion is used to achieve the disordering, thereby realizing the window region. Specifically, as shown in FIG. 18A, a disordering activating film 40, which is a low-density SiN insulating film, is formed on the top surface of the layered semiconductor structure 35. Next, photolithography and etching are used to form an opening portion 40a by removing the disordering activating film 40 in the region where the non-window region 38a is to be formed. After this, as shown in FIGS. 18B and 18C, a disordering inhibiting film 41, which is a dense SiN insulating film, is formed. The opening portion 40a is formed such that a width 40aa of the opening portion 40a is at least 3 micrometers greater than the current confinement width 33aa.

Next, RTA is used to perform the thermal processing in a short time to form the window region 38b directly below the disordering activating film 40, as shown in FIG. 18C. The non-window region 38a is directly below the disordering inhibiting film 41.

Since the width 40aa of the opening portion 40a of the disordering activating film 40 is at least 3 micrometers greater than the current confinement width 33aa, the diffusion of the group III vacancies during the thermal processing is restricted by the p-type dopant Zn. As a result, the group III vacancies are prevented from diffusing into the region where the active layer 10 is to emit light. Unintentional diffusion of the Zn occupying the group III site is also restricted.

Next, the disordering activating film 40 and the disordering inhibiting film 41 are removed, after which the insulating film 36 is formed. Photolithography and etching are used to form an opening portion 36a for enabling the top electrode 37 to contact the p-type contact layer 33.

Next, the top electrode 37 and the bottom electrode 4 on the bottom surface of the substrate 5 are formed. The substrate is cleaved to form the facets on which the low-reflection film 30 and the high-reflection film 31 are formed. The structure formed as described above is cut in a predetermined size to complete the semiconductor laser element 200.

MODIFICATION EXAMPLE

Figure 19:
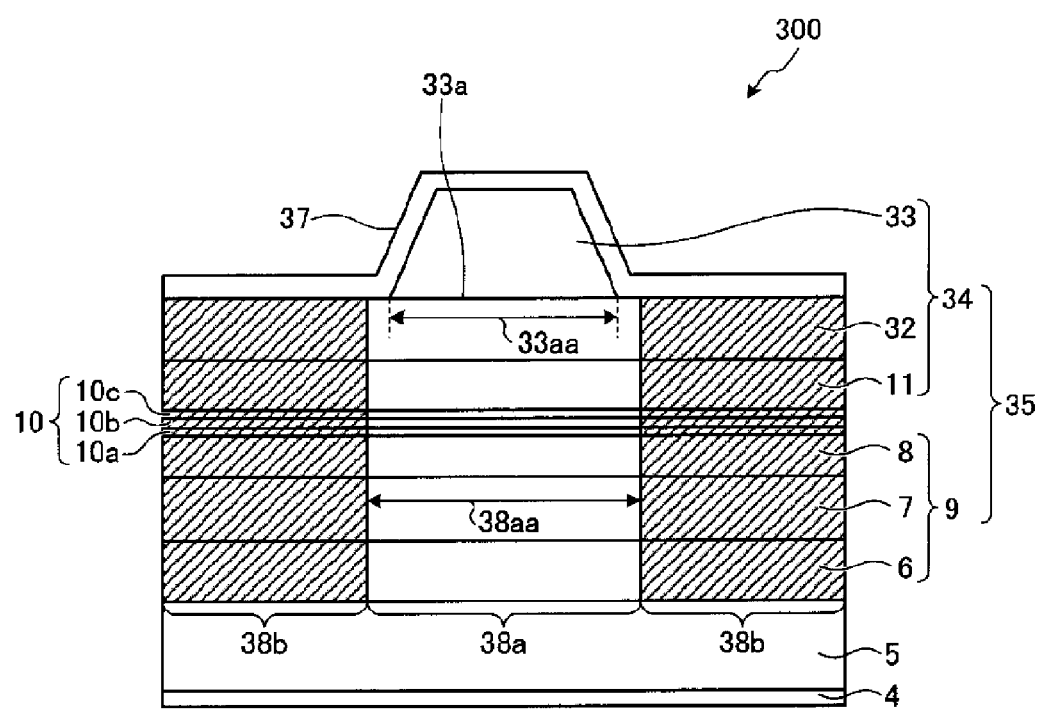
FIG. 19 is a cross-sectional view of a plane perpendicular to an emission direction in a body of a semiconductor laser element according to a modification of the second embodiment.

FIG. 19 is a cross-sectional view of a plane perpendicular to an emission direction in a body of a semiconductor laser element according to a modification example of the second embodiment. A semiconductor laser element 300 according to the modification example removes the insulating film 36 from the structure of the second embodiment, and other portions of this semiconductor laser element 300 are the same as those of the semiconductor laser element according to the second embodiment. In the semiconductor laser element 300, the bottom surface of the trapezoidal ridge structure of the p-type contact layer 33 is the current confinement region 33a and the width of the p-type contact layer 33 is the current confinement width 33aa. In this way, the semiconductor laser element 300 can achieve the same advantageous effects of the semiconductor laser element 200 without using an insulating layer.

In the above embodiments, the non-window region has a center position in a width direction that is perpendicular to both the emission direction and the layer direction, and this center position is formed to match the center position in the width direction of the current confinement region. However, the present invention is not limited to this condition. In other words, even if the width center of the non-window region does not match the width center of the current confinement region due to a manufacturing error or the like, the semiconductor laser element can still realize the advantageous effects described above as long as the difference between these two width centers is within an allowable range. This allowable range is a range of width center skew within which the value of the optical output ratio between semiconductor laser elements with thermal processing and semiconductor laser elements without thermal processing, as shown in FIG. 4, is above 0.96, thereby realizing the advantageous effects of the present invention.

The optical output ratio in a semiconductor laser element in which these width centers are skewed can be estimated based on the optical output ratio when the width centers match, as shown in FIG. 4. For example, if W2−W1 is 4 micrometers and the width centers are skewed by 1 micrometer, the optical output ratio becomes approximately 0.978 and the advantageous effects of the present invention can be realized. This value approximately matches the average value of the optical output ratio of approximately 1.005 when W2−W1 is 6 micrometers and the optical output ratio of approximately 0.95 when W2−W1 is 2 micrometers in the results shown in FIG. 4. Based on these results, the optical output ratio when the value of W2−W1 is X [micrometers] and the skew between the width centers is Y [micrometers] can be estimated as the average value of the optical output ratio when W2−W1 is (X+2Y) [micrometers] and the optical output ratio when W2−W1 is (X−2Y) [micrometers].

In the above embodiments, the first conduction type defines the n-type and the second conduction type defines the p-type, but instead, the first conduction type may define the p-type and the second conduction type may define the n-type. Furthermore, the semiconductor materials forming each substrate and layered semiconductor structure may be other materials such as InP, depending on the desired laser oscillation wavelength.

The semiconductor laser element 100 and semiconductor laser element 200 according to the above embodiments perform lateral single-mode operation, but the present invention can also be applied to semiconductor laser elements performing lateral multi-mode operation. In the embodiments described above, the desired lateral multi-mode operation can be realized by setting the current confinement width such that the active layer guides the light in the lateral multi-mode.

In the above embodiments, group III vacancies are used as the diffusion species, but one or a combination of p-type impurities including Zn, Mg, Be, and Cd, n-type impurities including Si, Se, and Sn, and interface impurities including O, C, H, and S may be used instead. Along with the diffusion species, the dopant given priority for replacing the group III site can be selected from among Zn, Mg, Be, Cd, Si, Se, and Sn.

The current confinement structure is not limited to being manufactured using the method of the above embodiments, and may instead be formed using a dielectric film or ion injection. In the above manufacturing methods, the process of disordering involves forming the disordering activating film and then forming the disordering inhibiting film, but the reverse order may be used to form the disordering inhibiting film and then form the disordering activating film.

The present invention is not limited to the above embodiments. For example, the structure of the semiconductor laser element is not limited to an SAS, and the formation method and structure of the window region are not limited to those described in the embodiments. The present invention may also be a combination of the components described above.

LIST OF REFERENCE NUMERALS

1, 29 body
2, 30 low-reflection film
3, 31 high-reflection film
4 bottom electrode
5 substrate
6 n-type buffer layer
7 n-type cladding layer
8 n-type guide layer
9 n-type semiconductor layer region
10 active layer
10a bottom barrier layer
10b quantum well layer
10c top barrier layer
11, 12 p-type guide layer
13, 32 p-type cladding layer
14, 33 p-type contact layer
15, 34 p-type semiconductor layer region 16 n-type current confinement layer
16a, 33a current confinement region
16aa, 33aa current confinement width
17, 35 layered semiconductor structure
17a, 38a non-window region
17aa, 38aa non-window width
17b, 38b window region
18, 37 top electrode
22, 40 disordering activating film
22a, 40a opening portion
22aa, 40aa width
27, 41 disordering inhibiting film
36 insulating film
100, 200, 300 semiconductor laser element

What is claimed is:

1. A semiconductor laser element comprising:
a substrate of a first conduction type; and
a layered semiconductor structure formed on the substrate, wherein the layered semiconductor structure includes
a first semiconductor layer of the first conduction type formed on the substrate, an active layer formed on the first semiconductor layer, and
a second semiconductor layer of a second conduction type formed on the active layer, the second conduction type being opposite to the first conduction type,
the first semiconductor layer, the active layer, and the second semiconductor layer include
a non-window region through which a light emitted from the active layer passes, and
a window region surrounding the non-window region, band gap energy of the active layer being larger in the window region than in the non-window region, and
the second semiconductor layer includes a current confinement layer that narrows a current path through which a current is injected into the active layer and that protrudes no less than 1.5 micrometers toward the non-window region from an interface between the window region and the non-window region,
wherein a center position of a current confinement region surrounded by the current confinement layer matches a center position of the window region, and
wherein a width of the non-window region is between 3 micrometers and 50 micrometers greater than a width of the current confinement region in a direction perpendicular to both a layer direction of the layered semiconductor structure and a direction in which the light is emitted.

2. The semiconductor laser element according to claim 1, wherein the width of the current confinement region is equal to or smaller than 10 micrometers.

3. The semiconductor laser element according to claim 2, wherein the width of the current confinement region is set to a value to obtain a lateral single-mode operation.

4. The semiconductor laser element according to claim 2, wherein the current confinement layer is a semiconductor layer of the first conduction type inserted within the second semiconductor layer.

5. The semiconductor laser element according to claim 2, wherein diffusion species diffused in the window region and at least one of a dopant of the first conduction type and a dopant of the second conduction type doped in the layered semiconductor structure replace a site of a corresponding group in a compound semiconductor forming the layered semiconductor structure.

6. The semiconductor laser element according to claim 2, wherein the window region is formed by a vacancy diffusion.

7. The semiconductor laser element according to claim 2, further comprising: a first electrode for injecting a first carrier of the first conduction type into the active layer via the first semiconductor layer; and a second electrode for injecting a second carrier of the second conduction type into the active layer via the second semiconductor layer.

8. The semiconductor laser element according to claim 1, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

9. The semiconductor laser element according to claim 2, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

10. The semiconductor laser element according to claim 3, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

11. The semiconductor laser element according to claim 4, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

12. The semiconductor laser element according to claim 5, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

13. The semiconductor laser element according to claim 6, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

14. The semiconductor laser element according to claim 7, wherein the center position of a current confinement region matches the center position of the window region within an allowable range, and wherein the allowable range is a range of width center skew within which the value of the optical output ratio between the semiconductor laser elements with thermal processing and the semiconductor laser elements without thermal processing is above 0.96.

* * * * *